(12) United States Patent
Tamaru

(10) Patent No.: US 7,978,021 B2
(45) Date of Patent: Jul. 12, 2011

(54) BALANCED-TO-UNBALANCED TRANSFORMER AND AMPLIFIER CIRCUIT MODULE

(75) Inventor: Ikuo Tamaru, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 249 days.

(21) Appl. No.: 12/483,271

(22) Filed: Jun. 12, 2009

(65) Prior Publication Data

US 2009/0315636 A1 Dec. 24, 2009

(30) Foreign Application Priority Data

Jun. 20, 2008 (JP) ................................. 2008-162323

(51) Int. Cl.
*H03H 7/42* (2006.01)
*H01P 3/08* (2006.01)
(52) U.S. Cl. .......................................... 333/25; 333/246
(58) Field of Classification Search .................... 333/25, 333/26, 238, 246
See application file for complete search history.

(56) References Cited

U.S. PATENT DOCUMENTS

| | | | |
|---|---|---|---|
| 5,949,299 A | | 9/1999 | Harada |
| 7,330,085 B2 * | | 2/2008 | Ezzeddine ....................... 333/26 |
| 7,368,996 B2 * | | 5/2008 | Tanoue et al. ................. 330/301 |
| 7,688,158 B2 * | | 3/2010 | Rohani et al. .................... 333/25 |

| | | | |
|---|---|---|---|
| 2002/0180561 A1 | 12/2002 | Kawahara et al. |
| 2005/0116787 A1 | 6/2005 | Ohi et al. |
| 2005/0184831 A1 | 8/2005 | Yasuda et al. |
| 2007/0103256 A1 | 5/2007 | Ishiwata |

FOREIGN PATENT DOCUMENTS

| | | |
|---|---|---|
| JP | 10-200360 A | 7/1998 |
| JP | 2002-314347 A | 10/2002 |
| JP | 2003-046358 A | 2/2003 |
| JP | 2005-166702 A | 6/2005 |
| JP | 2005-198167 A | 7/2005 |
| JP | 2005-260903 A | 9/2005 |
| JP | 2007-129565 A | 5/2007 |
| JP | 2008-98769 A | 4/2008 |

OTHER PUBLICATIONS

Official Communication issued in corresponding Japanese Patent Application No. 2008-162328, mailed on Mar. 23, 2010.
Bakalski et al., "A Fully Integrated 5.3 GHz, 2.4 V., 0.3 W SiGe-Bipolar Power Amplifier With 50 Ω Output," IEEE Journal of Solid State Circuits, vol. 39, Issue 7, Jul. 2004, pp. 1006-1014, USA.

* cited by examiner

*Primary Examiner* — Dean O Takaoka
(74) *Attorney, Agent, or Firm* — Keating & Bennett, LLP

(57) ABSTRACT

A balanced-to-unbalanced transformer includes a +90° phase shift circuit, which is disposed between a branch point connected to an unbalanced terminal and a first terminal, and a −90° phase shift circuit, which is disposed between the branch point and a second terminal. A first inductor is connected between the first terminal and a power supply terminal, and a second inductor is connected between the branch point and the power supply terminal. A power-supply-terminal-side capacitor is connected in shunt between the power supply terminal and a ground. A second-terminal-side series inductor is connected in series between the branch point and the second terminal.

14 Claims, 11 Drawing Sheets

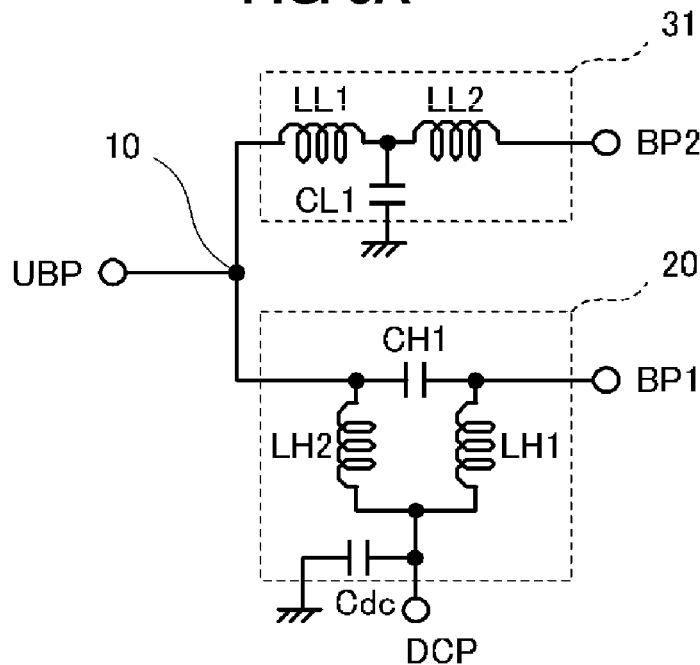
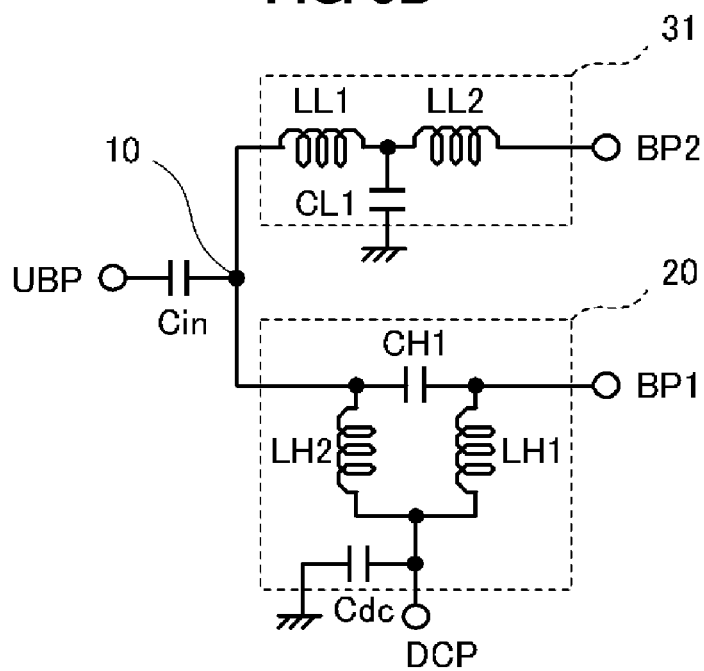

BALANCED-TO-UNBALANCED TRANSFORMER AND AMPLIFIER CIRCUIT MODULE

BACKGROUND OF THE INVENTION

1. Field of the Invention

The present invention relates to a balanced-to-unbalanced transformer including a +90° phase shifter and a −90° phase shifter and to an amplifier circuit module including the balanced-to-unbalanced transformer.

2. Description of the Related Art

A balanced-to-unbalanced transformer including a +90° phase shifter and a −90° phase shifter is disclosed in Japanese Unexamined Patent Application Publication No. 2005-198167. FIG. 1 is a circuit diagram illustrating an example of the transformer. Referring to FIG. 1, a high-pass filter 120 is a +90° phase shifter that has a cutoff frequency lower a design frequency f0 and that is designed so that an output phase with respect to an input phase is +90° at the design frequency f0. A low-pass filter 130 is a −90° phase shifter that has a cutoff frequency higher than the design frequency f0 and that is designed so that an output phase with respect to an input phase is −90° at the design frequency f0. With this configuration, a balanced signal and an unbalanced signal having inverted polarities are mutually transformed.

The balanced-to-unbalanced transformer including the high-pass filter and the low-pass filter according to Japanese Unexamined Patent Application Publication No. 2005-198167 is often used in combination with an amplifier that is used in a mobile phone terminal, for example, and that includes a balanced terminal. In such a use, a circuit configuration of applying a bias voltage to the amplifier via the balanced-to-unbalanced transformer may be used to miniaturize a mounting board.

However, in the circuit illustrated in FIG. 1, bias power supplies are provided for respective balanced terminals P2 and P3, which increases the size of the circuit. Also, a plurality of power supply circuits are required, which increases the cost of the device. Furthermore, in the circuit configuration according to Japanese Unexamined Patent Application Publication No. 2005-198167, when a DC power supply functioning as a bias power supply is disposed on the terminal P3 side, a bias voltage (current) flows to the unbalanced terminal P1 side other than to the terminal P3 side.

SUMMARY OF THE INVENTION

To overcome the problems described above, preferred embodiments of the present invention provide a balanced-to-unbalanced transformer arranged to supply a bias voltage to two balanced terminals from one power supply while preventing an increase in size and complication of a circuit and also provide an amplifier circuit module including the balanced-to-unbalanced transformer.

According to a preferred embodiment of the present invention, a balanced-to-unbalanced transformer includes a power supply terminal, an unbalanced terminal, a pair of balanced terminals including first and second terminals connected to the unbalanced terminal via a branch point, a +90° phase shift circuit including a first-terminal-side series capacitor connected in series to a line placed between the branch point and the first terminal, and a −90° phase shift circuit including a second-terminal-side series inductor connected in series to a line disposed between the branch point and the second terminal. The +90° phase shift circuit includes a first inductor having one end connected to a first terminal side of the first-terminal-side series capacitor and the other end connected to the power supply terminal, and a second inductor having one end connected to a branch point side of the first-terminal-side series capacitor and the other end connected to the power supply terminal.

With this configuration, a bias voltage can be supplied to the balanced terminals including the first and second terminals via the circuit of the balanced-to-unbalanced transformer. Thus, the necessity of further providing a power supply circuit is eliminated, so that a balanced amplifier circuit including a balanced amplifier can be defined by a simple circuit configuration.

An unbalanced-terminal-side series capacitor may preferably be connected in series between the unbalanced terminal and the branch point.

With this configuration, a bias voltage applied from the power supply terminal can be prevented from flowing to the unbalanced terminal side. Furthermore, the unbalanced-terminal-side series capacitor also functions as a high-pass filter, and thus, unnecessary low-frequency signals can be attenuated.

The −90° phase shift circuit may preferably include a second-terminal-side parallel capacitor connected between a second terminal side of the second-terminal-side series inductor and a ground.

With this configuration, the −90° phase shift circuit can be defined by a small number of circuit elements.

The −90° phase shift circuit may preferably include a second-terminal-side parallel capacitor connected between a second terminal side of the second-terminal-side series inductor and the power supply terminal.

With this configuration, the −90° phase shift circuit can be defined by a small number of circuit elements.

The −90° phase shift circuit may preferably include a second-terminal-side second series inductor connected in series between a junction point between the second-terminal-side series inductor and the second-terminal-side parallel capacitor and the second terminal.

With this configuration, the degree of freedom to design the −90° phase shift circuit as a low-pass filter is increased. In addition, an increase in order enables a lower slope of a bandpass characteristic near the band. Accordingly, a slope of an amplitude difference, which is one of the balance characteristics, can be reduced and a balance characteristic can be improved.

The +90° phase shift circuit may preferably include a power-supply-terminal-side capacitor connected between the power supply terminal and a ground.

With this configuration, radio frequency signals are reliably grounded by the power supply terminal, so that the +90° phase shift circuit operates stably. In addition, leakage of signals from the power supply terminal to a bias voltage supply circuit side can be prevented.

The +90° phase shift circuit and the −90° phase shift circuit may preferably be provided in a multilayer board including laminated dielectric layers provided with electrode patterns, and center locations of the +90° phase shift circuit and the −90° phase shift circuit may be different from each other in a perspective view from one of principal surfaces of the multilayer board.

With this configuration, interference between the +90° phase shift circuit and the −90° phase shift circuit can be prevented.

Circuit elements except the power-supply-terminal-side capacitor and the −90° phase shift circuit may preferably be provided in a multilayer board including laminated dielectric layers provided with electrode patterns.

With this configuration in which the power-supply-terminal-side capacitor is externally attached, the other circuit elements can be defined as a four-terminal module including a multilayer board.

A ground electrode and a capacitor electrode may preferably be provided on upper and lower sides of a laminating direction of the first and second inductors included in the +90° phase shift circuit and the second-terminal-side series inductor included in the −90° phase shift circuit.

With this configuration, the inductors are sandwiched by the capacitor electrodes, such that leakage of a magnetic field generated by the inductors to the outside of the multilayer board can be prevented and an influence on an external circuit can be minimized.

The multilayer board may preferably include laminated dielectric layers having a substantially rectangular shape, at least a bottom surface of the multilayer board may preferably be provided with the first and second terminals, the unbalanced terminal, and the power supply terminal, and the first and second terminals may preferably be arranged on mutually-facing sides of the multilayer board.

With this configuration, the isolation between the two balanced terminals is improved.

The multilayer board may preferably include laminated dielectric layers having a substantially rectangular shape, at least a bottom surface of the multilayer board may preferably be provided with the first and second terminals, the unbalanced terminal, and the power supply terminal, and the first and second terminals may preferably be arranged on one side of the multilayer board so as to sandwich the power supply terminal.

With this configuration, a terminal electrode is disposed between the two balanced terminals, so that the isolation between the balanced terminals is improved.

The multilayer board may preferably include laminated dielectric layers having a substantially rectangular shape, at least a bottom surface of the multilayer board may preferably be provided with the first and second terminals, the unbalanced terminal, the power supply terminal, and a ground terminal that is in conduction with the ground electrode, and the first and second terminals may preferably be arranged on one side of the multilayer board so as to sandwich the ground terminal.

With this configuration, a terminal electrode is disposed between the two balanced terminals, so that the isolation between the balanced terminals is improved.

The multilayer board may preferably include laminated dielectric layers having a substantially rectangular shape, at least a bottom surface of the multilayer board may preferably be provided with the first and second terminals, the unbalanced terminal, and the power supply terminal, and the first and second terminals, the unbalanced terminal, and the power supply terminal may preferably be arranged on four sides or four corners of the multilayer board, respectively.

With this configuration, coupling between the respective terminals is prevented and isolation is improved.

According to a preferred embodiment of the present invention, an amplifier circuit module includes the above-described balanced-to-unbalanced transformer, and a balanced amplifier that is connected to the first and second terminals and that performs balanced amplification.

According to various preferred embodiments of the present invention, a bias voltage can be supplied to the balanced terminals including the first and second terminals via the circuit of the balanced-to-unbalanced transformer. Thus, the necessity of further providing a power supply circuit can be eliminated, so that a balanced amplifier circuit including a balanced amplifier can be defined by a simple circuit configuration. In addition, by connecting the unbalanced-terminal-side series capacitor between the unbalanced terminal and the branch point, a bias voltage applied from the power supply terminal can be prevented from flowing to the unbalanced terminal side. Furthermore, unnecessary low-frequency signals are attenuated.

Other features, elements, steps, characteristics and advantages of the present invention will become more apparent from the following detailed description of preferred embodiments of the present invention with reference to the attached drawings.

BRIEF DESCRIPTION OF THE DRAWINGS

FIGS. 8A and 8B are circuit diagrams of balanced-to-unbalanced transformers according to a fourth preferred embodiment of the present invention.

DETAILED DESCRIPTION OF PREFERRED EMBODIMENTS

First Preferred Embodiment

A configuration of a balanced-to-unbalanced transformer according to a first preferred embodiment of the present invention is described with reference to FIGS. 2 to 4.

Figure 1:
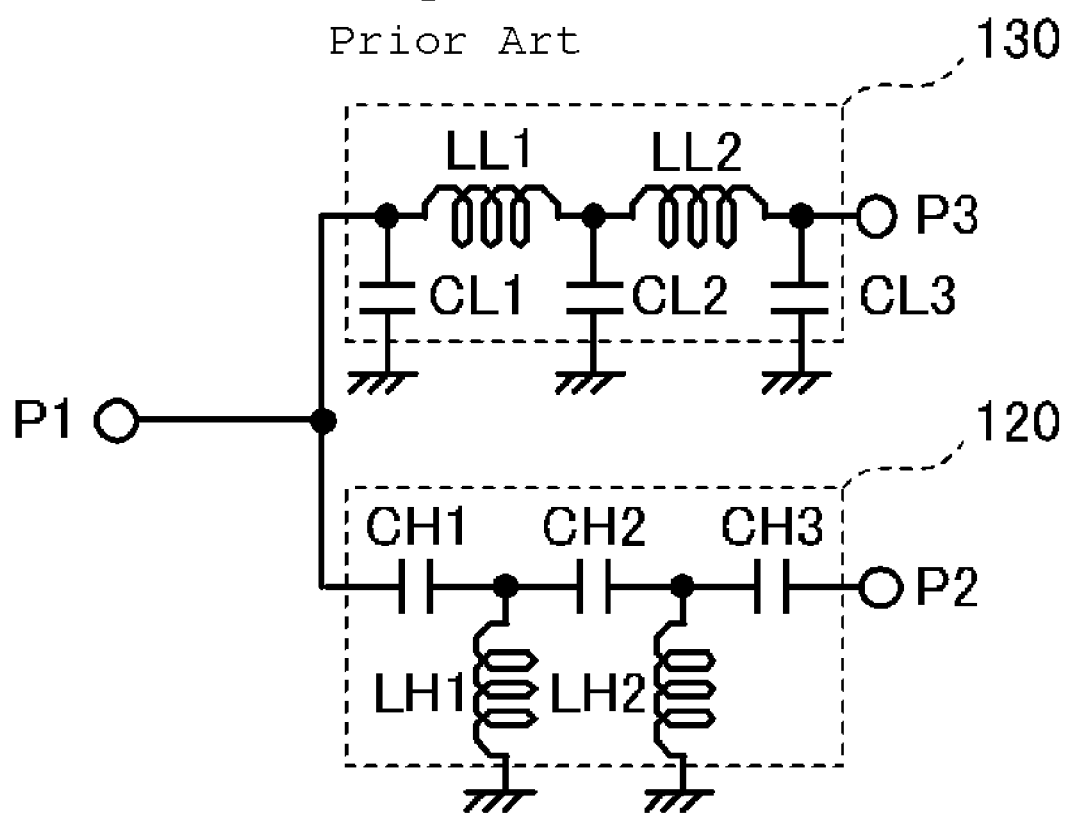
FIG. 1 is a circuit diagram illustrating an example of a balanced-to-unbalanced transformer including a +90° phase shifter and a −90° phase shifter, disclosed in the related art.
Figure 2:
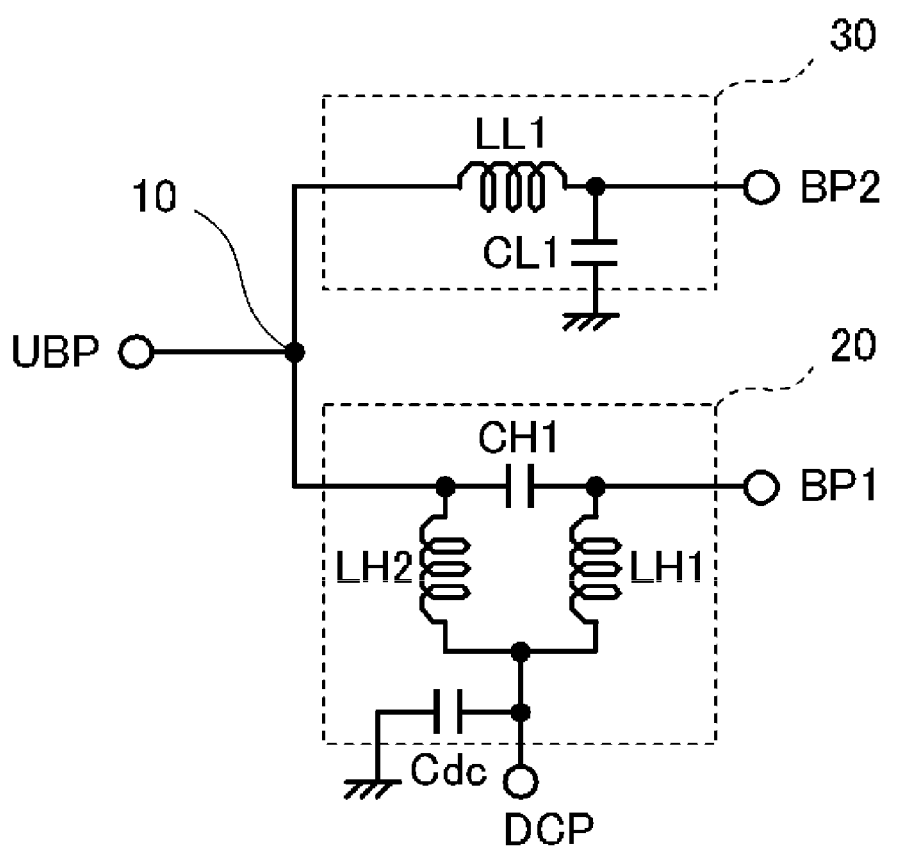
FIG. 2 is a circuit diagram of a balanced-to-unbalanced transformer according to a first preferred embodiment of the present invention.

FIG. 2 is a circuit diagram of a balanced-to-unbalanced transformer 101. The balanced-to-unbalanced transformer 101 includes a pair of balanced terminals including a first terminal BP1 and a second terminal BP2 and an unbalanced terminal UBP. A +90° phase shift circuit 20 is disposed between a branch point 10 connected to the unbalanced terminal UBP and the first terminal BP1. A −90° phase shift circuit 30 is disposed between the branch point 10 and the second terminal BP2.

The +90° phase shift circuit 20 includes a first-terminal-side series capacitor CH1 connected in series to a line, a first inductor LH1 connected between the first terminal BP1 and a power supply terminal DCP such that DC can pass therethrough, a second inductor LH2 connected between the branch point 10 and the power supply terminal DCP such that DC can pass therethrough, and a power-supply-terminal-side capacitor Cdc connected in shunt between the power supply terminal DCP and a ground.

The −90° phase shift circuit 30 includes a second-terminal-side series inductor LL1 connected in series to a line between the branch point 10 and the second terminal BP2, and a second-terminal-side parallel capacitor CL1 connected between the second terminal side of the second-terminal-side series inductor LL1 and the ground.

The power supply terminal DCP is RF (radio frequency)-grounded by the power-supply-terminal-side capacitor Cdc. Thus, in the +90° phase shift circuit 20, the first and second inductors LH1 and LH2 connected in shunt and the first-terminal-side series capacitor CH1 connected in series define an LCL high-pass filter having a substantially π shape. The +90° phase shift circuit 20 generates a phase difference of +90° (90° phase lead) between the unbalanced terminal UBP and the first terminal BP1 in a usable frequency.

In the −90° phase shift circuit 30, an LC circuit including the second-terminal-side parallel capacitor CL1 connected in shunt and the second-terminal-side series inductor connected in series defines a low-pass filter. The −90° phase shift circuit 30 functions to generate a phase difference of −90° (90° phase lag) between the unbalanced terminal UBP and the second terminal BP2 in a usable frequency.

With this circuit configuration, a bias voltage applied to the power supply terminal DCP is supplied to the first terminal BP1 through a path: DCP→first inductor LH1→first terminal BP1. In addition, the bias voltage is supplied to the second terminal BP2 through a path: DCP→second inductor LH2→second-terminal-side series inductor LL1→second terminal BP2.

The inductor LH2 arranged to supply a bias voltage can also preferably be used as a design element of the +90° phase shift circuit 20, so that the degree of freedom to design the +90° phase shift circuit 20 is improved.

Figure 3:
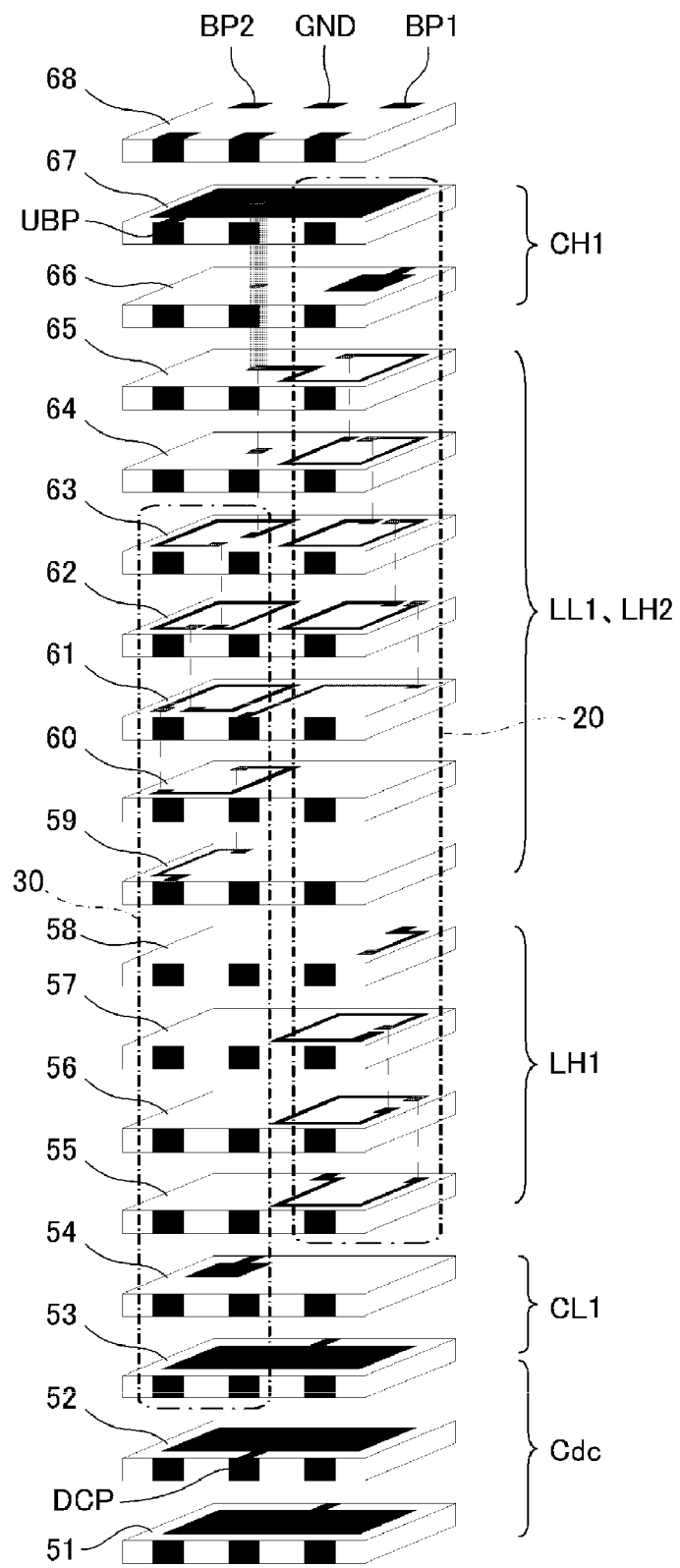
FIG. 3 is an exploded perspective view illustrating configurations of respective layers of a multilayer board where the balanced-to-unbalanced transformer illustrated in FIG. 2 is defined by the multilayer board.

FIG. 3 is an exploded perspective view illustrating configurations of respective layers of a multilayer board in the case where the balanced-to-unbalanced transformer 101 illustrated in FIG. 2 is defined by the multilayer board. FIG. 4 is a perspective view illustrating the balanced-to-unbalanced transformer 101. In FIG. 3, reference numerals 51 to 68 denote dielectric layers, and an electrode having a predetermined pattern is provided on a top surface of the respective dielectric layers 51 to 67. In addition, terminals defining mounting electrodes are provided on portions of side surfaces of the dielectric layers 51 to 68, a bottom surface of the dielectric layer 51, and a top surface of the dielectric layer 68. Note that the terminals are formed after the dielectric layers 51 to 68 have been laminated in a state of green sheets, and then fired and cut into elements.

Figure 4:
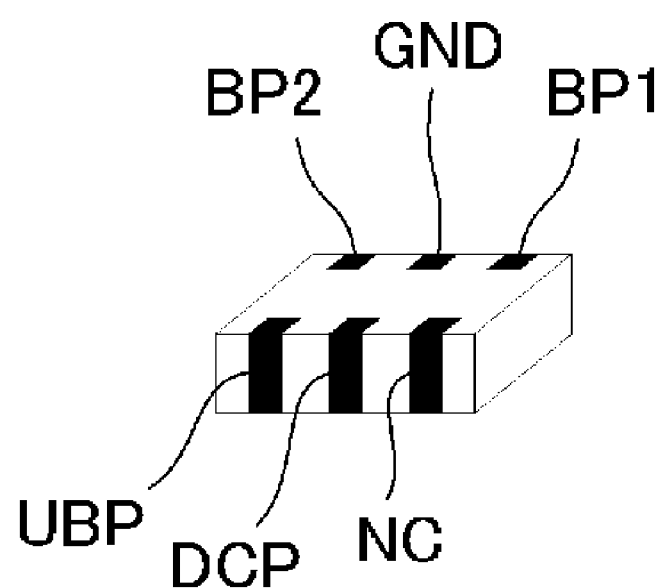
FIG. 4 is a perspective view of the balanced-to-unbalanced transformer illustrated in FIG. 2.

Reference symbols attached to the respective mounting electrodes illustrated in FIG. 4 correspond to the respective terminals illustrated in FIG. 2. In FIG. 4, GND denotes a ground terminal, and NC denotes a null terminal.

As illustrated in FIG. 3, the electrodes provided on the dielectric layers 51 and 52 define the power-supply-terminal-side capacitor Cdc. The electrodes provided on the dielectric layers 53 and 54 define the second-terminal-side parallel capacitor CL1.

The electrode patterns and via electrodes provided on the dielectric layers 55 to 58 define the first inductor LH1. The inductor electrodes and via electrodes provided on the left-half in FIG. 3 of the dielectric layers 59 to 65 define the second-terminal-side series inductor LL1. Likewise, the inductor electrodes and via electrodes provided on the right-half in FIG. 3 of the dielectric layers 61 to 65 define the second inductor LH2. In this manner, center locations of the +90° phase shift circuit 20 and the −90° phase shift circuit 30 are different from each other in a perspective view from one of principal surfaces of the multilayer board. With this configuration, interference between the +90° phase shift circuit 20 and the −90° phase shift circuit 30 is effectively suppressed.

In addition, the electrodes provided on the dielectric layers 66 and 67 define the first-terminal-side series capacitor CH1.

In this manner, the balanced-to-unbalanced transformer is configured as a surface-mounted chip component.

By arranging the electrode connected to the unbalanced terminal UBP at a distance from the mounting board (from the GND surface of the mounting board), leakage of RF signals from the unbalanced terminal UBP to the ground can be prevented.

Also, by arranging the inductors LH1 and LH2 one above the other, at a distance from each other, unnecessary coupling between the inductors LH1 and LH2 can be effectively suppressed.

Furthermore, by providing the ground electrode on the dielectric layer 53 and the capacitor electrode on the dielectric layer 67 one above the other in the laminating direction of the first inductor (LH1), the second inductor (LH2), and the second-terminal-side series inductor (LL1), leakage of a magnetic field generated by the inductors LH1, LH2, and LL1 to the outside of the multilayer board can be effectively suppressed, whereby an influence on an external circuit can be significantly reduced. Also, coupling with an external circuit can be suppressed, so that interference of the external circuit can be prevented.

The balanced terminals BP1 and BP2 extend to one side in the longitudinal direction of the multilayer board in the state in which the +90° phase shift circuit 20 and the −90° phase shift circuit 30 are arranged side by side in the longitudinal direction of the multilayer board. Accordingly, a routing length to the balanced terminals BP1 and BP2 is decreased, which produces a reduced loss.

The power supply terminal DCP extends to the approximate center of one side in the longitudinal direction of the multilayer board. Accordingly, the +90° phase shift circuit 20 and the −90° phase shift circuit 30 can be easily spaced apart at a distance from each other in the multilayer board.

Preferably, the ground terminal GND is disposed between the first and second terminals BP1 and BP2 as balanced terminals. With this arrangement, unnecessary coupling between the first and second terminals BP1 and BP2 is interrupted by the power supply terminal DCP.

Second Preferred Embodiment

Figure 5A:
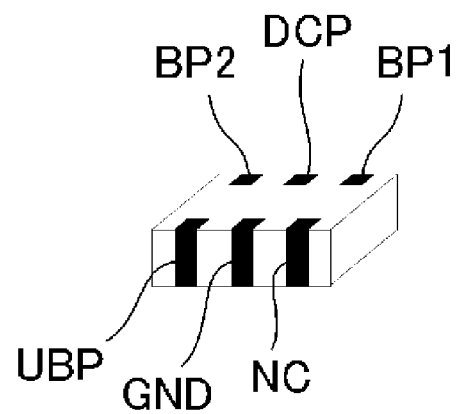
FIGS. 5A, 5B, and 5C are perspective views of a balanced-to-unbalanced transformer according a second preferred embodiment of the present invention, illustrating various manners of extending respective terminals to edge surfaces and top and bottom surfaces of a multilayer board.
Figure 5B:
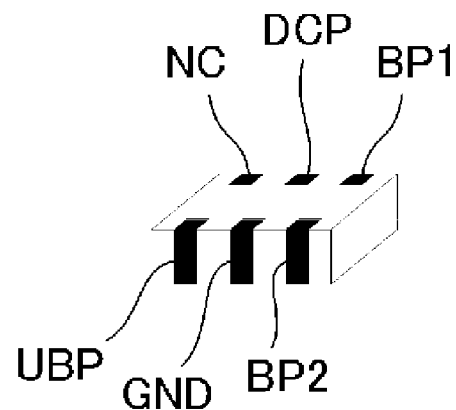
Figure 5C:
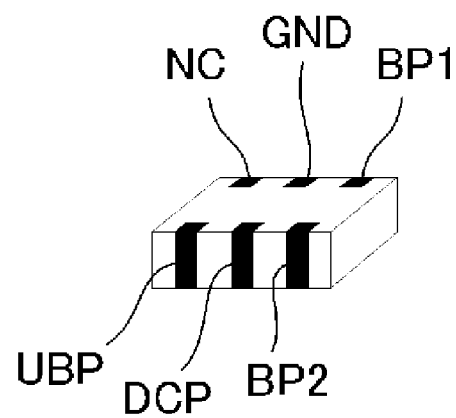

FIGS. 5A to 5C illustrate examples of ways to extend the respective terminals to the edge surfaces and the top and bottom surfaces of the multilayer board. The configuration and circuit of an interior main portion are the same or substantially the same as those in the first preferred embodiment.

In the configuration illustrated in FIGS. 3 and 4 according to the first preferred embodiment, the ground terminal GND is disposed between the balanced terminals BP1 and BP2. Alternatively, as illustrated in FIG. 5A, the power supply terminal DCP that is RF-grounded by the power-supply-terminal-side capacitor Cdc may preferably be disposed between the balanced terminals BP1 and BP2.

Alternatively, as illustrated in FIGS. 5B and 5C, the first and second terminals BP1 and BP2 as balanced terminals may preferably be arranged on the sides facing each other of the multilayer board.

Third Preferred Embodiment

Figure 6:
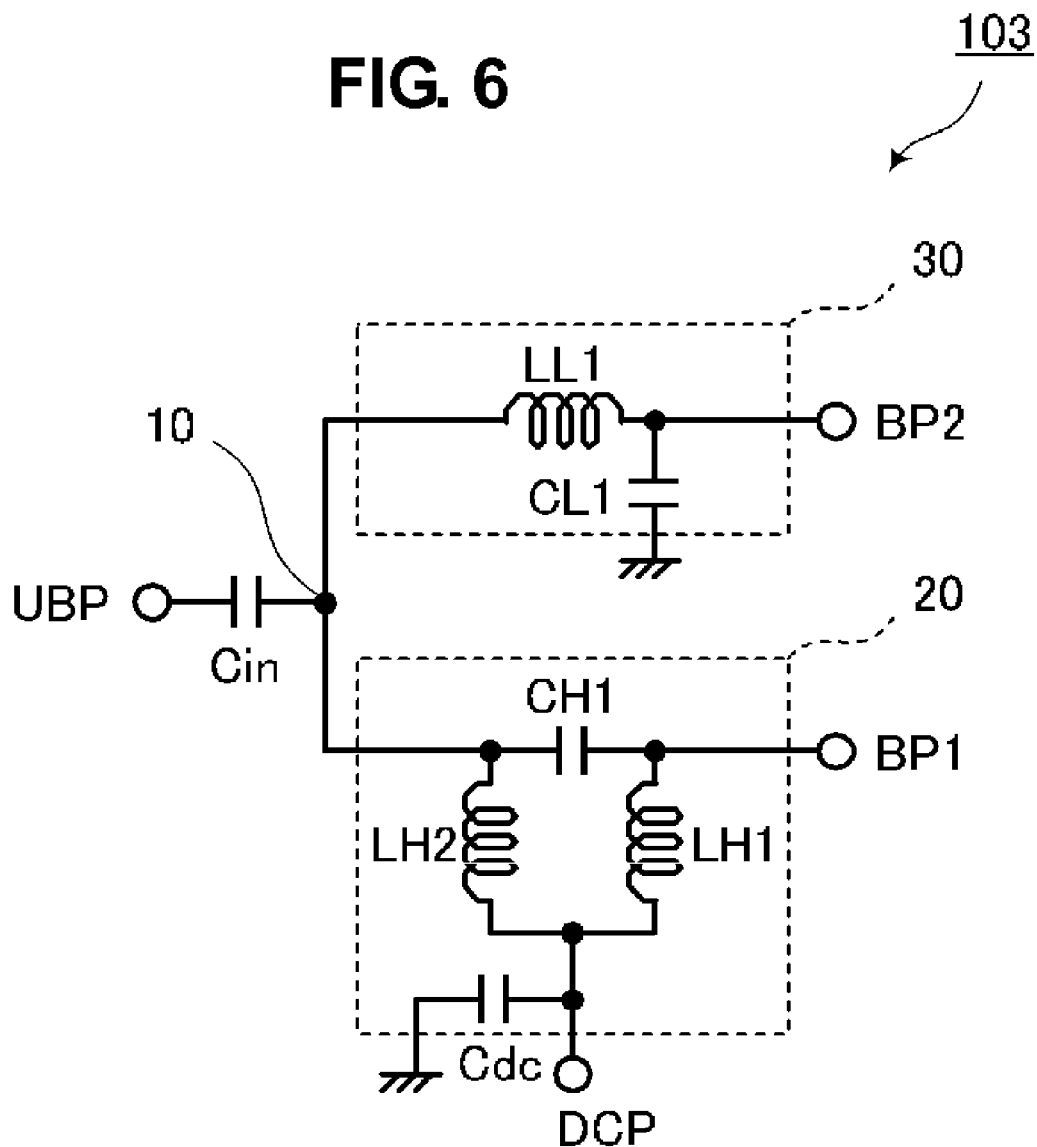
FIG. 6 is a circuit diagram of a balanced-to-unbalanced transformer according to a third preferred embodiment of the present invention.

FIG. 6 is a circuit diagram of a balanced-to-unbalanced transformer 103 according to a third preferred embodiment of the present invention. The difference from the balanced-to-unbalanced transformer 101 illustrated in FIG. 2 according to the first preferred embodiment is that an unbalanced-terminal-side series capacitor Cin is connected in series between the unbalanced terminal UBP and the branch point 10. Other than the series capacitor Cin, the configuration according to the third preferred embodiment is preferably the same or substantially the same as that according to the first preferred embodiment.

With this configuration, the portion between the power supply terminal DCP and the unbalanced terminal UBP is brought into a DC cutoff state by the unbalanced-terminal-side series capacitor Cin, so that a bias voltage (current) applied to the power supply terminal DCP can be prevented from being applied to the unbalanced terminal UBP side. Also, a bias voltage (current) on the side of a circuit connected to the unbalanced terminal UBP can be prevented from being applied to the side of the balanced terminals BP1 and BP2.

The unbalanced-terminal-side series capacitor Cin preferably also functions as a high-pass filter. The capacitance of the capacitor Cin enables the design of an attenuation characteristic of frequencies lower than the frequencies in a passband.

Figure 7:
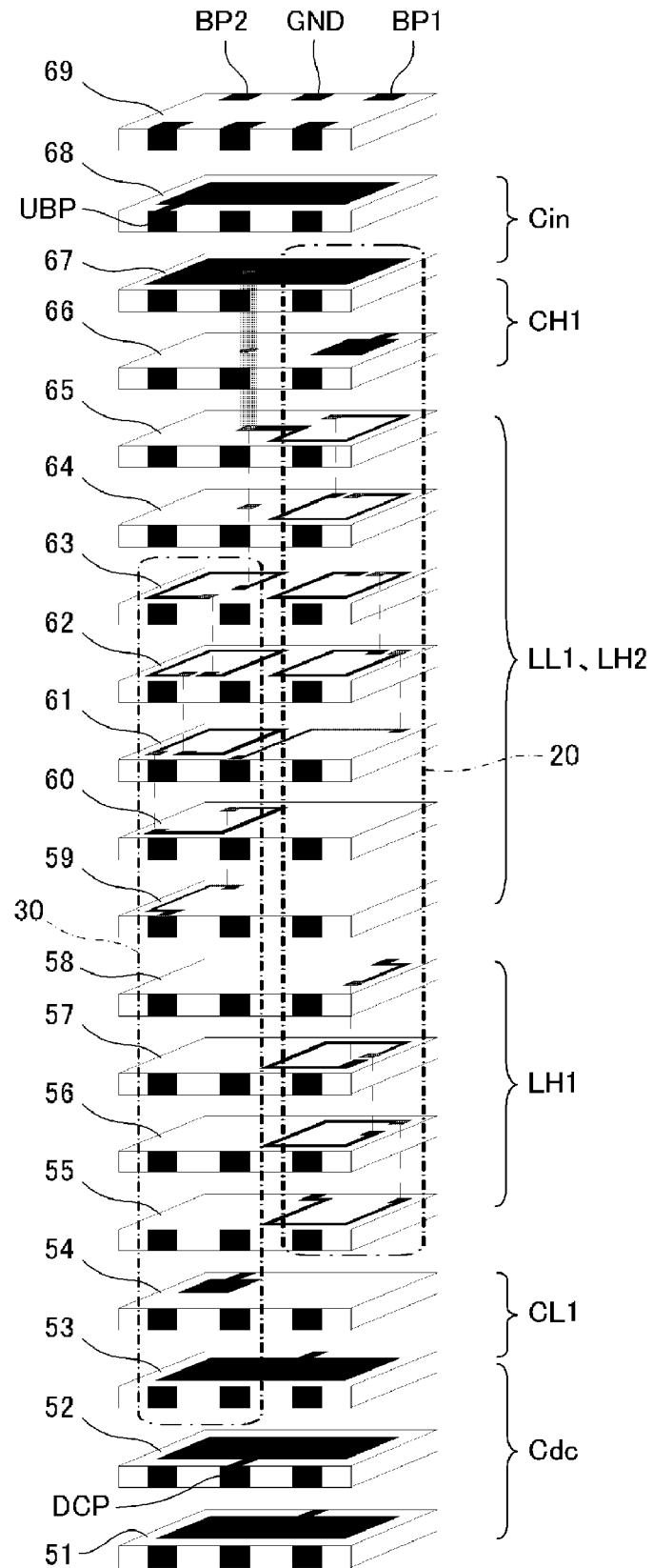
FIG. 7 is an exploded perspective view of a multilayer board where the balanced-to-unbalanced transformer illustrated in FIG. 6 is defined by the multilayer board.

FIG. 7 is an exploded perspective view of a multilayer board where the balanced-to-unbalanced transformer 103 illustrated in FIG. 6 is defined by the multilayer board.

In this example, the electrodes provided on the dielectric layers 67 and 68 define the unbalanced-terminal-side series capacitor Cin. Other than this arrangement, the configuration is the same or substantially the same as that illustrated in FIG. 3.

As illustrated in FIG. 7, by providing the unbalanced-terminal-side series capacitor Cin in an upper portion of the multilayer board, leakage of signals from the unbalanced terminal UBP to the ground electrode of the mounting board can be prevented, so that the occurrence of loss can be effectively suppressed.

Fourth Preferred Embodiment

FIGS. 8A and 8B are circuit diagrams of balanced-to-unbalanced transformers according to a fourth preferred embodiment of the present invention. The balanced-to-unbalanced transformer 104A illustrated in FIG. 8A includes a second-terminal-side second series inductor LL2 between the second terminal BP2 and the second-terminal-side parallel capacitor CL1. Other than this arrangement, the configuration is the same or substantially the same as that illustrated in FIG. 2.

Also, the balanced-to-unbalanced transformer 104B illustrated in FIG. 8B includes the second-terminal-side second series inductor LL2 between the second terminal BP2 and the second-terminal-side parallel capacitor CL1. Other than this arrangement, the configuration is preferably the same or substantially the same as that illustrated in FIG. 6.

By providing the second series inductor LL2, the degree of freedom to design a −90° phase shift circuit 31 as a low-pass filter is increased. Also, an increase in order enables a reduced slope of a bandpass characteristic near the band. Accordingly, a slope of an amplitude difference, which is one of balance characteristics, can be reduced and a balance characteristic can be improved.

Fifth Preferred Embodiment

Figure 9A:
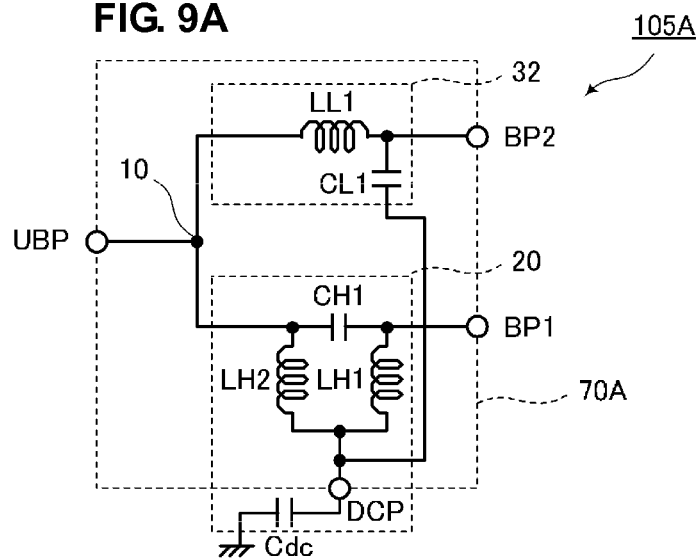
FIGS. 9A, 9B, and 9C are circuit diagrams of balanced-to-unbalanced transformers according to a fifth preferred embodiment of the present invention.
Figure 9B:
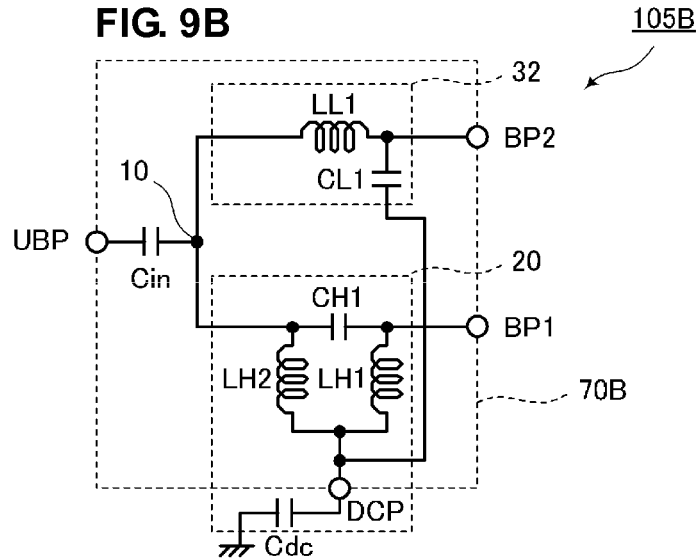
Figure 9C:
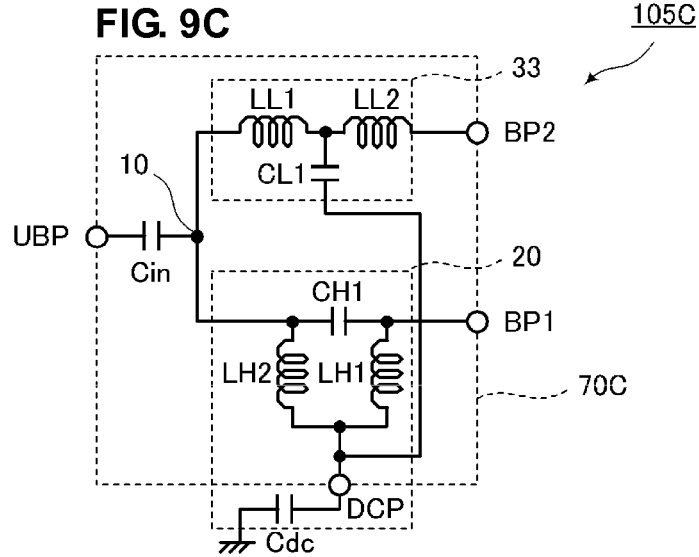

FIGS. 9A to 9C are circuit diagrams of balanced-to-unbalanced transformers according to a fifth preferred embodiment of the present invention.

In the balanced-to-unbalanced transformer 105A illustrated in FIG. 9A, one end of the second-terminal-side parallel capacitor CL1 of a −90° phase shift circuit 32 connects to the second terminal side of the second-terminal-side series inductor LL1, and the other end thereof connects to the power supply terminal DCP. The power supply terminal DCP is RF-grounded by the power-supply-terminal-side capacitor Cdc, so that the −90° phase shift circuit 32 functions in the same or substantially the same manner as the −90° phase shift circuit 30 illustrated in FIG. 2.

In the first preferred embodiment, the power-supply-terminal-side capacitor Cdc is provided in the multilayer board, as illustrated in FIG. 3. On the other hand, in the example illustrated in FIG. 9A, the circuit elements except the power-supply-terminal-side capacitor Cdc are provided in a multilayer board 70A. Accordingly, the balanced-to-unbalanced transformer 105A is defined by a chip component of the multilayer board 70A and the externally-attached power-supply-terminal-side capacitor Cdc.

In the balanced-to-unbalanced transformer 105B illustrated in FIG. 9B, as in the balanced-to-unbalanced transformer 103 illustrated in FIG. 6, the series capacitor Cin is disposed between the unbalanced terminal UBP and the branch point 10. One end of the second-terminal-side parallel capacitor CL1 of the −90° phase shift circuit 32 connects to the second terminal side of the second-terminal-side series inductor LL1, and the other end thereof connects to the power supply terminal DCP. The circuit elements except for the power-supply-terminal-side capacitor Cdc are provided in a multilayer board 70B.

In the balanced-to-unbalanced transformer 105C illustrated in FIG. 9C, as in the balanced-to-unbalanced transformer 104B illustrated in FIG. 8B, the series capacitor Cin is disposed between the unbalanced terminal UBP and the branch point 10. One end of the second-terminal-side parallel capacitor CL1 of a −90° phase shift circuit 33 connects to the second terminal side of the second-terminal-side series inductor LL1, and the other end thereof connects to the power supply terminal DCP. The circuit elements except for the power-supply-terminal-side capacitor Cdc are provided in a multilayer board 70C.

Figure 10A:
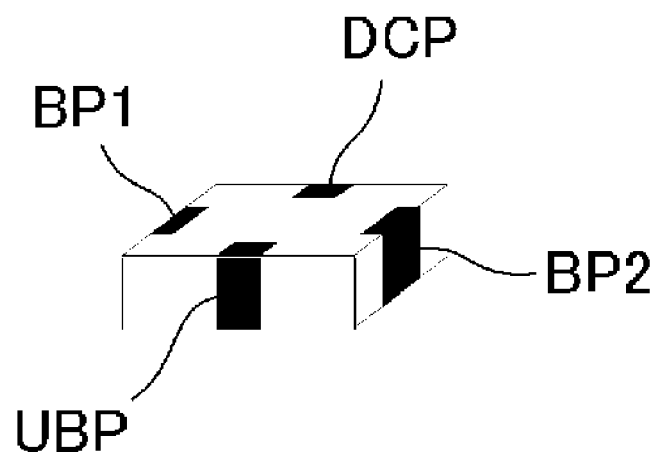
FIGS. 10A and 10B are perspective views of chip components including any of the multilayer boards of the balanced-to-unbalanced transformers illustrated in FIGS. 9A to 9C.
Figure 10B:
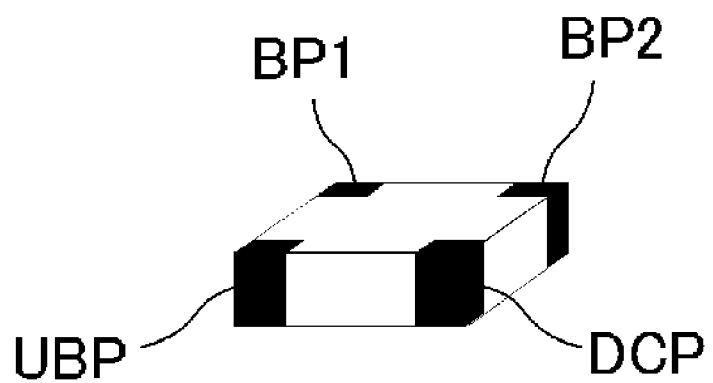

FIGS. 10A and 10B are perspective views of chip components defined by the multilayer boards 70A, 70B, and 70C in the balanced-to-unbalanced transformers illustrated in FIGS. 9A to 9C. In the example illustrated in FIG. 10A, the unbalanced terminal UBP, the balanced terminals BP1 and BP2, and the power supply terminal DCP are disposed at approximate center portions of the four sides of the chip component defined by the multilayer board. In the example illustrated in FIG. 10B, the unbalanced terminal UBP, the balanced terminals BP1 and BP2, and the power supply terminal DCP are disposed at the four corners of the chip component.

Such a configuration with four terminals is suitable for a chip size of about 1.0 mm×about 0.5 mm, for example, in which a configuration including five terminals is difficult.

Furthermore, by disposing the balanced terminals BP1 and BP2 on the sides or corners facing each other of the multilayer board, the balanced terminals BP1 and BP2 are arranged at a distance from each other. Also, the power supply terminal DCP that is RF-grounded interrupts unnecessary coupling.

Sixth Preferred Embodiment

Figure 11:
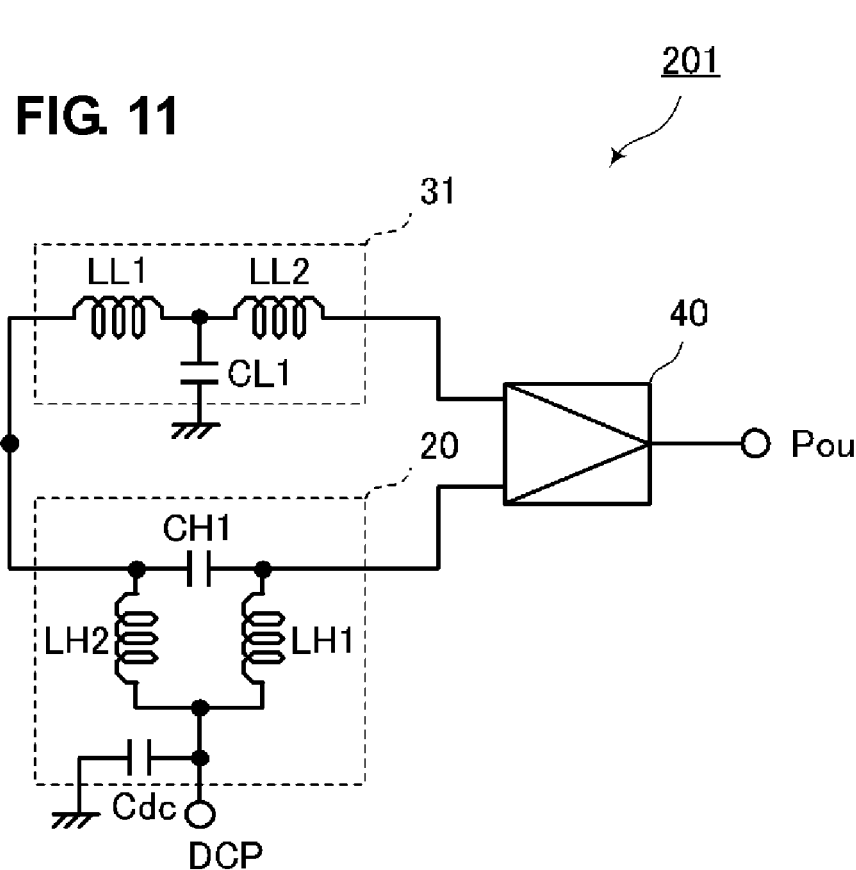
FIG. 11 is a circuit diagram of an amplifier circuit module according to a sixth preferred embodiment of the present invention.

FIG. 11 is a circuit diagram of an amplifier circuit module 201 according to a sixth preferred embodiment of the present invention. In FIG. 11, the +90° phase shift circuit 20, the −90° phase shift circuit 31, and the unbalanced-terminal-side series capacitor Cin define a balanced-to-unbalanced transformer. The configuration of this balanced-to-unbalanced transformer is the same or substantially the same as that illustrated in FIG. 8B. A balanced amplifier 40 of a balanced input type is connected to the balanced terminals of this balanced-to-unbalanced transformer.

With this configuration, a signal input from an unbalanced input terminal Pin is transformed to a balanced signal, is amplified by the balanced amplifier 40, and is output as an unbalanced signal from an unbalanced output terminal Pout.

The balanced-to-unbalanced transformer in the amplifier circuit module 201 illustrated in FIG. 11 is provided in a multilayer board, as described above in the respective preferred embodiments, and the balanced amplifier 40 is mounted on the multilayer board. Accordingly, the devices can be combined into a single chip component.

In the above-described preferred embodiments, the respective terminals defined as mounting electrodes are disposed on the edge surfaces and the top and bottom surfaces of the multilayer board. Alternatively, the mounting electrodes may preferably be disposed only on the bottom surface of the multilayer board so that an LGA (Land Grid Array) is defined. With this configuration, a mounting area can be reduced.

While preferred embodiments of the invention have been described above, it is to be understood that variations and modifications will be apparent to those skilled in the art without departing from the scope and spirit of the invention. The scope of the invention, therefore, is to be determined solely by the following claims.

What is claimed is:

1. A balanced-to-unbalanced transformer comprising:
a power supply terminal;
an unbalanced terminal;
a pair of balanced terminals including first and second terminals connected to the unbalanced terminal via a branch point;
a +90° phase shift circuit including a first-terminal-side series capacitor connected in series to a line between the branch point and the first terminal; and
a −90° phase shift circuit including a second-terminal-side series inductor connected in series to a line between the branch point and the second terminal; wherein
the +90° phase shift circuit includes:
a first inductor having a first end connected to a first terminal side of the first-terminal-side series capacitor and a second end connected to the power supply terminal; and
a second inductor having a first end connected to a branch point side of the first-terminal-side series capacitor and a second end connected to the power supply terminal.

2. The balanced-to-unbalanced transformer according to claim 1, wherein an unbalanced-terminal-side series capacitor is connected in series between the unbalanced terminal and the branch point.

3. The balanced-to-unbalanced transformer according to claim 1, wherein the −90° phase shift circuit includes a second-terminal-side parallel capacitor connected between a second terminal side of the second-terminal-side series inductor and a ground.

4. The balanced-to-unbalanced transformer according to claim 1, wherein the −90° phase shift circuit includes a second-terminal-side parallel capacitor connected between a second terminal side of the second-terminal-side series inductor and the power supply terminal.

5. The balanced-to-unbalanced transformer according to claim 1, wherein the −90° phase shift circuit includes a second-terminal-side second series inductor connected in series between a junction point between the second-terminal-side series inductor and the second-terminal-side parallel capacitor and the second terminal.

6. The balanced-to-unbalanced transformer according to claim 1, wherein the +90° phase shift circuit includes a power-supply-terminal-side capacitor connected between the power supply terminal and a ground.

7. The balanced-to-unbalanced transformer according to claim 1, further comprising a multilayer board including laminated dielectric layers provided with electrode patterns, wherein the +90° phase shift circuit and the −90° phase shift circuit are provided in the multilayer board, and center locations of the +90° phase shift circuit and the −90° phase shift circuit are different from each other in a perspective view from one of principal surfaces of the multilayer board.

8. The balanced-to-unbalanced transformer according to claim 6, further comprising a multilayer board including laminated dielectric layers, wherein circuit elements except the power-supply-terminal-side capacitor and the −90° phase shift circuit are provided in the multilayer board.

9. The balanced-to-unbalanced transformer according to claim 7, wherein a ground electrode and a capacitor electrode are provided on upper and lower sides in a laminating direction of the multilayer board of the first and second inductors included in the +90° phase shift circuit and the second-terminal-side series inductor included in the −90° phase shift circuit.

10. The balanced-to-unbalanced transformer according to claim 7, wherein the multilayer board includes laminated dielectric layers having a substantially rectangular shape, at least a bottom surface of the multilayer board being provided with the first and second terminals, the unbalanced terminal, and the power supply terminal, and the first and second terminals are disposed on opposite sides of the multilayer board.

11. The balanced-to-unbalanced transformer according to claim 7, wherein the multilayer board includes laminated dielectric layers having a substantially rectangular shape, at least a bottom surface of the multilayer board being provided with the first and second terminals, the unbalanced terminal, and the power supply terminal, and the first and second terminals are disposed on one side of the multilayer board so as to sandwich the power supply terminal.

12. The balanced-to-unbalanced transformer according to claim 7, wherein the multilayer board includes laminated dielectric layers having a substantially rectangular shape, at least a bottom surface of the multilayer board being provided with the first and second terminals, the unbalanced terminal, the power supply terminal, and a ground terminal that is in conduction with the ground electrode, and the first and second terminals are disposed on one side of the multilayer board so as to sandwich the ground terminal.

13. The balanced-to-unbalanced transformer according to claim 7, wherein the multilayer board includes laminated dielectric layers in a substantially rectangular shape, at least a bottom surface of the multilayer board being provided with the first and second terminals, the unbalanced terminal, and the power supply terminal, and the first and second terminals, the unbalanced terminal, and the power supply terminal are disposed on four sides or four corners of the multilayer board, respectively.

14. An amplifier circuit module comprising:
  the balanced-to-unbalanced transformer according to claim 1; and
  a balanced amplifier connected to the first and second terminals and arranged to perform balanced amplification.

* * * * *